(12) United States Patent
Lang et al.

(10) Patent No.: US 7,614,023 B2
(45) Date of Patent: Nov. 3, 2009

(54) SYSTEM FOR ESTIMATING A TERMINAL CAPACITANCE AND FOR CHARACTERIZING A CIRCUIT

(75) Inventors: Alfred Lang, Weilheim (DE); Stefan Bergler, München (DE)

(73) Assignee: Infineon Technologies AG, Munich (DE)

(*) Notice: Subject to any disclaimer, the term of this patent is extended or adjusted under 35 U.S.C. 154(b) by 401 days.

(21) Appl. No.: 11/586,426

(22) Filed: Oct. 25, 2006

(65) Prior Publication Data

US 2008/0127013 A1    May 29, 2008

(51) Int. Cl.
G06F 17/50    (2006.01)
(52) U.S. Cl. .............................. 716/6; 716/5
(58) Field of Classification Search ............ 716/4–6
See application file for complete search history.

(56) References Cited

U.S. PATENT DOCUMENTS 7,114,142 B1 * 9/2006 Segal et al. .................... 716/13

2005/0131661 A1    6/2005  Lang et al.
2005/0232066 A1   10/2005  Ishibashi et al.
2005/0283750 A1   12/2005  Kosugi et al.
2006/0095869 A1 *  5/2006  Levy ........................... 716/1

FOREIGN PATENT DOCUMENTS

| EP | 0 223 586 A2 | 5/1986 |
| EP | 0 204 178 A2 | 12/1986 |
| JP | 2001167143 A | 6/2001 |

* cited by examiner

Primary Examiner—Vuthe Siek
(74) Attorney, Agent, or Firm—Brinks Hofer Gilson & Lione

(57) ABSTRACT

A method for estimating a terminal capacitance associated with a terminal of a cell of a digital circuit includes providing first and second capacitance values associated with an upper and lower bound, respectively, on the terminal capacitance, providing results of a timing analysis of the digital circuit, and determining an estimation value for the terminal capacitance based on the results of the timing analysis and at least one of the first and second capacitance values. A system for estimating a terminal capacitance includes a storage unit which stores the first and second capacitance values and a processor which performs a timing analysis of the digital circuit and determines an estimation value for the terminal capacitance based on the timing analysis and at least one of the first and second capacitance values.

18 Claims, 5 Drawing Sheets

SYSTEM FOR ESTIMATING A TERMINAL CAPACITANCE AND FOR CHARACTERIZING A CIRCUIT

BACKGROUND

1. Technical Field

The present invention relates to estimating a terminal capacitance and for characterizing a circuit. In particular, the present invention relates to estimating a terminal capacitance at a given operation point.

2. Background Information

The operation of many electronic design automation tools, such as tools for logic synthesis or timing analysis, is based on capacitance values associated with pins or terminals of cells of a digital circuit. In conventional electronic design automation tools, the capacitance associated with a pin or a terminal of a cell is set equal to one of a plurality of predetermined capacitance values that have been previously established by pre-characterizing the cell. The predetermined capacitance value may correspond, e.g., to the maximum and minimum effective capacitance of the pin or terminal in a relevant range of operation parameters. For example, to establish that timing constraints are met, many conventional timing analysis tools employ the maximum capacitance value and the minimum capacitance value to determine signal propagation times in a data path or a clock path, respectively. However, such conventional methods for determining signal propagation times, in which capacitance values are approximated by minimum or maximum capacitance values in the relevant operation range, frequently provide excessively pessimistic predictions for the performance characteristics of a digital circuit, such as setup slack.

BRIEF SUMMARY

A method for estimating a terminal capacitance is provided, which terminal capacitance is associated with a terminal of a cell of a digital circuit. The method includes providing a first capacitance value associated with an upper bound on the terminal capacitance and a second capacitance value associated with a lower bound on the terminal capacitance, providing results of a timing analysis of the digital circuit, and determining an estimation value for the terminal capacitance based on the results of the timing analysis and at least one of the first capacitance value and the second capacitance value. An advantage of this embodiment is that the terminal capacitance associated with the terminal of the cell at a given operation point may be estimated based only on the upper bound and the lower bound on the terminal capacitance, respectively, that are also employed in conventional timing analysis tools as well as the results of the timing analysis.

A method is also disclosed for estimating a terminal capacitance at a given operation point, the terminal capacitance being associated with an input terminal of a cell of a digital circuit. The method comprises providing a first capacitance value associated with an upper bound on the terminal capacitance and a second capacitance value associated with a lower bound on the terminal capacitance, determining input pulse edge characteristics associated with the input terminal in a timing analysis of the digital circuit, and estimating the terminal capacitance by interpolating between the first capacitance value and the second capacitance value based on the input pulse edge characteristics. An advantage of this embodiment is that the capacitance value at the given operation point may be estimated based only on the upper and lower bounds on an input terminal capacitance value that are also employed in conventional electronic design automation tools, in combination with input pulse edge characteristics, which are readily available when a timing analysis is performed.

A computer program is provided that comprises instructions which, when executed by a computer, make the computer perform methods for estimating a terminal capacitance.

A system for estimating a terminal capacitance associated with a terminal of a cell of a digital circuit is provided. The system includes a storage unit which stores a first capacitance value associated with an upper bound on the terminal capacitance and a second capacitance value associated with a lower bound on the terminal capacitance, and a processor which performs a timing analysis of the digital circuit and is coupled to the storage unit and retrieves the first and second capacitance values therefrom. The processor further determines an estimation value for the terminal capacitance based on the timing analysis and based on at least one of the first and second capacitance values.

BRIEF DESCRIPTION OF THE DRAWINGS

Additional features and advantages of the present invention, as well as the best mode currently contemplated for carrying out the invention, will become more readily understood from the following description of embodiments, by means of example only, when taken in conjunction with the accompanying drawings, wherein.

DETAILED DESCRIPTION

Figure 1:
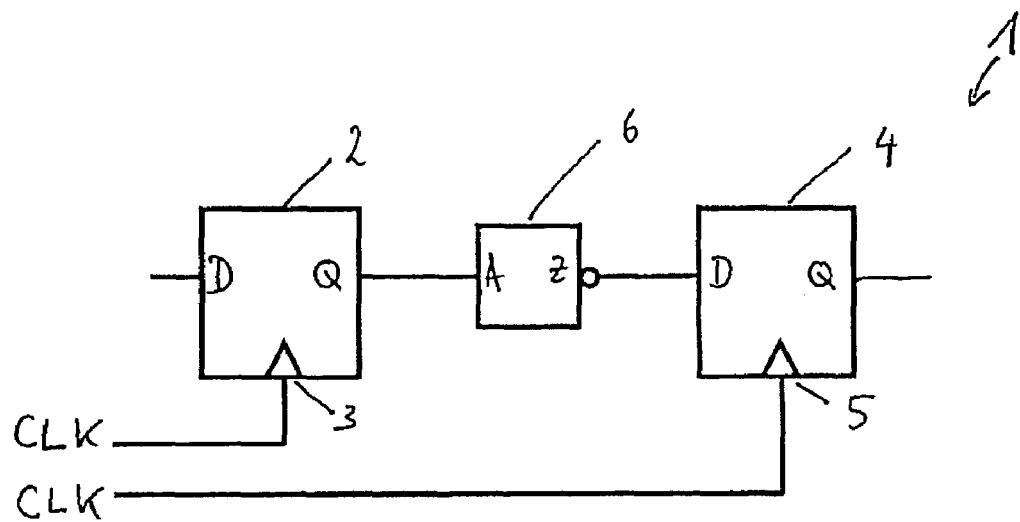
FIG. 1 is a schematic illustration of a digital circuit.

FIG. 1 is a schematic representation of a digital circuit 1 which includes two registers 2 and 4 having clock signal inputs 3 and 5, respectively. The output terminal of register 2 is connected to the input terminal of register 4 via an inverter 6.

A key feature of many electronic design automation tools, such as delay calculators or static timing analysis, is to verify digital circuits in view of timing constraints. For example, for the digital circuit 1 to operate correctly, the signal propagation time from the output terminal of register 2 to the input terminal of register 4 will typically be required to be smaller than the clock cycle time. One way to determine the signal propagation time associated with a data path and, more specifically, with the logical elements or cells located on the data path is to pre-characterize the cells, such as inverter 6, by simulations of the cell in which the delay time associated with the cell is determined, e.g., as a function of input slew and output load. The delay times determined by such simulations for a plurality of input slew values and output load values, respectively, may be stored for subsequent use in electronic design automation tools. To determine the delay time associated with a cell at a given operation point, i.e., for a given input slew and a given output load, the delay time values determined by pre-characterizing the cell are retrieved and an interpolation between the stored delay time values is performed to obtain the delay time at the given operation point.

The operation point of a cell of a digital circuit which is used for determining the delay time associated with the cell is, however, dependent on the input capacitance of another cell connected to its output terminal. For example, in the digital circuit 1, the output load of register 2 is dependent on the input capacitance of inverter 6. The input capacitance of the cell is in turn also dependent on the operation point, for example due to a capacitive coupling between the output and the input terminals of the cell. This operation point dependence of the input capacitance is frequently neglected in electronic design automation tools, in which the input capacitance is conventionally approximated by an upper bound or a lower bound on the input terminal capacitance for determining signal propagation times on a data path or clock path, respectively, which upper and lower bounds have previously been established by pre-characterizing the cell. This approximation of input capacitances may frequently give rise to excessively pessimistic estimations for signal propagation times.

Figure 2:
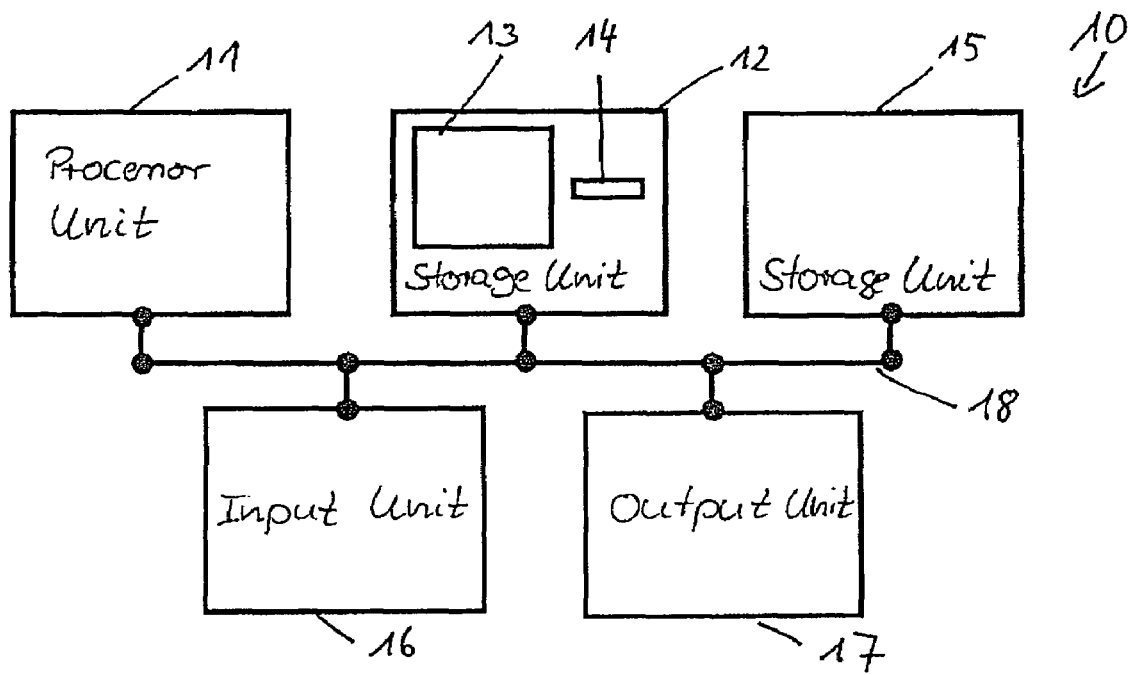
FIG. 2 is a schematic representation illustrating a system for estimating a terminal capacitance.

FIG. 2 illustrates a system for estimating a terminal capacitance. The system is generally indicated at 10 and comprises a processor unit 11, a storage unit 12, a further storage unit 15, an input unit 16 and an output unit 17, which are interconnected via a common bus 18. The processor unit 11, which may be any conventional processor unit, such as the CPU of a computer, retrieves and processes data from the storage unit 12 and the further storage unit 15 and processes data stored in these storage units. The storage unit 12 which may be any conventional storage unit, such as a ROM, RAM or a hard disk, has stored thereon delay time data 13 and additional characterizing data 14 for each cell of the digital circuit. The delay time data 13 comprises information on the delay time of a cell based on the input slew and the output load of the cell, as previously explained with reference to FIG. 1, such as in the form of a two-dimensional data array or a mathematical function. The data 14 includes additional information characterizing a cell of the digital circuit and includes in particular the upper bound and lower bound on the input capacitance of the cell, which have also been described above. The further storage unit 15 which may be formed integrally with the storage unit 12 and which may also be any suitable storage unit, such as a ROM, RAM or hard disk, has stored thereon information relating to the design of the digital circuit, e.g., in the form of a wiring list or wiring table specifying the interconnections of the cells including the digital circuit.

The processor unit 11 retrieves wiring data specifying the digital circuit to be analyzed from the further storage unit 15 and performs, e.g., a timing analysis of the circuit employing the delay time data 13 and the additional data 14 characterizing cells of the digital circuit and stored in the storage unit 12. The processor unit 11 uses the results of the timing analysis to determine an estimation value for terminal capacitances associated with input terminals of cells of the digital circuit.

Figure 3:
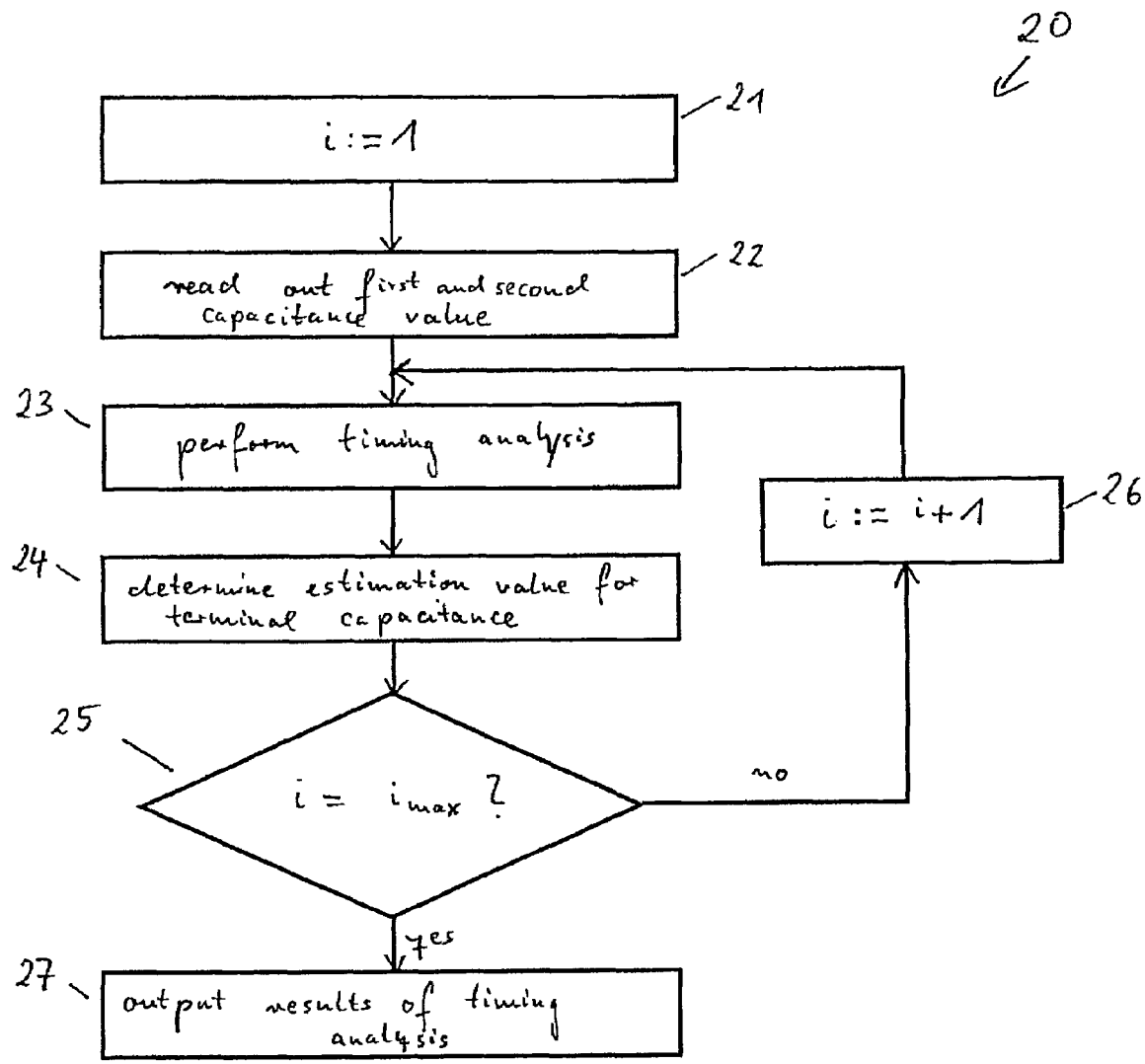
FIG. 3 is a flowchart illustrating a method for analyzing a digital circuit.

FIG. 3 illustrates a method for analyzing a digital circuit. The method is generally indicated at 20 and may be performed by the processor unit 11 of the system 10. Generally speaking, the method 20 is an iterative method in which a timing analysis is performed and, subsequently, an estimation value for an operation point dependent terminal capacitance, or a plurality of estimation values for operation point dependent terminal capacitances associated with a plurality of cells of the digital circuit, are determined based on the results of the timing analysis. These estimation values are subsequently employed for re-analyzing the digital circuit, i.e., for performing yet another timing analysis in which the estimation values for the operation point dependent terminal capacitances are employed.

In the method 20, at step 21, a counter i is initialized which reflects the number of iterations. Subsequently, at step 22, first and second predefined capacitance values are read out for the input terminals of a cell, or for a plurality of cells, including the digital circuit. The first and second capacitance values represent the upper and lower bounds, respectively, on the input terminal capacitance of the respective cell and may be given by the maximum and minimum capacitance values in a relevant operation range. Next, at step 23, a timing analysis of the digital circuit is performed. In the first iteration, the output loads of each cell are determined by approximating the input terminal capacitance of another cell connected to a cell output terminal by the first or second capacitance value, depending on whether the signal path is a data path or a clock path, respectively. In this sense, during the first iteration, step 23 is comparable to a conventional timing analysis. Subsequently, at step 24, an estimation value is determined for the terminal capacitance of the cell, e.g., the terminal capacitance of terminal A of inverter 6 in FIG. 1, based on the results of the timing analysis. At step 25, it is determined next whether a predefined maximum number of iterations, $i_{max}$, has been reached. In one embodiment, $i_{max}$ may be set equal to 3 or 4. If the maximum number of iterations $i_{max}$ has not yet been reached, at step 26, the iteration counter i is incremented by 1, and steps 23 and 24 are iterated. Importantly, in the second or higher iteration the timing analysis at step 23 is no longer based on the predefined first or second capacitance values of the terminal capacitances that have been obtained by pre-characterizing the cell, but on the estimation value for the terminal capacitance at the given operation point that has been determined at step 24 in the previous iteration. Since this estimation value will typically provide a better approximation for the operation point dependent terminal capacitance than the first or second capacitance value, problems with a conventional timing analyses may be reduced by employing the estimation value in the next iteration at step 23. Steps 23 and 24 are repeated until the predetermined maximum number of iterations $i_{max}$ has been reached, in which case the result of the timing analysis is output at step 27.

While in FIG. 3 the timing analysis and the determining of the estimation value for the operation point dependent terminal capacitance in steps 23 and 24 are repeated a predetermined number of times, other termination criteria for the iteration may be employed with equal facility. For example, the timing analysis and determination of the estimation value for the terminal capacitance are repeated until the values for the terminal capacitances have converged to a certain degree, i.e., until the variation in estimation values between successive iterations has dropped below a given threshold. Alternatively, the iteration may be terminated when the results obtained for signal propagation times have converged to a specific degree, i.e., when the difference in signal propagation times between successive iterations has dropped below a predetermined threshold.

Figure 4:
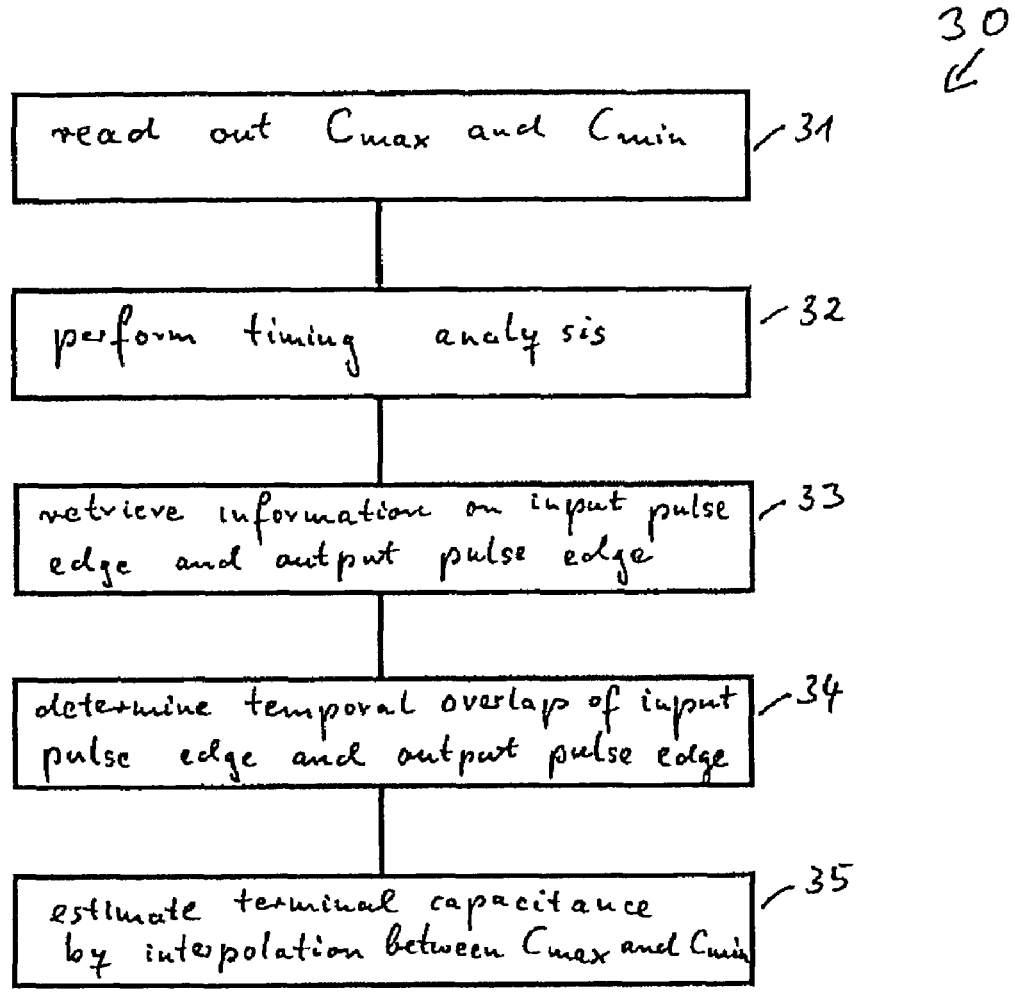
FIG. 4 is a flowchart illustrating a method for estimating a terminal capacitance.

FIG. 4 illustrates a method for estimating a terminal capacitance. The method is generally indicated at 30 and may be used to implement steps 22-24 in the method 20 of FIG. 3. First, at step 31, maximum and minimum capacitance values $C_{max}$ and $C_{min}$, respectively, are retrieved which have previously been determined by pre-characterizing the cell. Next, at step 32, a timing analysis is performed in which the terminal capacitance associated with the terminal of the cell is approximated by the maximum or minimum capacitance value, respectively, depending on whether the signal path is a data path or a clock signal path. At step 33, information on an input pulse edge and an output pulse edge associated with the cell which comprises the terminal are retrieved from the results of the timing analysis performed at step 32. The information on the input pulse edge broadly includes any information related to a time dependent voltage increase or decrease at the input terminal of the cell, and the information on the output pulse edge broadly includes any information on a time dependent voltage decrease or increase at the output terminal of the cell. At step 34, a temporal overlap of the input pulse edge and the output pulse edge is determined. Finally, at step 35, an estimation value for the terminal capacitance is determined by interpolating between the maximum capacitance value $C_{max}$ and the minimum capacitance value $C_{min}$, wherein the interpolation is based on the temporal overlap previously determined at step 34.

It is to be understood that, while the methods of FIGS. 3 and 4 have been described referring to a case in which the estimation value for the input terminal capacitance of one cell is determined, in a digital circuit that comprises plural cells, the corresponding method steps may be performed for input terminals of a plurality of or all cells including the digital circuit. For example, in this case, in the method of FIG. 4, steps 33-35 may be performed for input terminals of a plurality of or all cells of the digital circuit.

The estimation of the effective operation point dependent terminal capacitance illustrated in steps 34 and 35 which is based on an interpolation between maximum and minimum capacitance values based on a temporal overlap of the input pulse edge and the output pulse edge of a cell. This procedure is based on the fact that a capacitive coupling between the output terminal and the input terminal of the cell is an important factor that causes operation point dependent variations in input terminal capacitance. Due to the capacitive coupling between the output terminal and the input terminal, a voltage change at the output terminal will cause charges to move to or from the input terminal, respectively, thereby modifying the timing behavior of the input terminal, similar to the "Miller-effect". For timing considerations in a digital circuit, this back coupling of the output terminal onto the input terminal is only relevant as long as the voltage of the input terminal has not yet reached its steady state. More specifically, while a time varying voltage of the output terminal will always cause charges to flow to or from the input terminal, this flow of electrical charge is irrelevant for signal timing once the voltage at the input terminal has reached its steady state. Therefore, depending on the temporal overlap of the input pulse edge at the input terminal of the cell and the output pulse edge at the output terminal of the cell, the effective input terminal capacitance that is relevant for timing considerations is affected more or less strongly by the capacitive coupling between the output terminal and the input terminal. In one case of zero overlap between the input pulse edge and the output pulse edge, the voltage change at the input terminal that is relevant for signal timing is unaffected by the capacitive coupling between output and input terminals, and the input terminal capacitance is assigned the minimum capacitance value $C_{min}$ that has been previously determined in pre-characterizing the cell. In the other extreme case of full overlap between the input pulse edge and the output pulse edge, the effective input terminal capacitance is increased due to the capacitive coupling between the terminals of the cell, such that the effective terminal capacitance of the input terminal is assigned the maximum value $C_{max}$ that has been determined in pre-characterizing the cell. In all other cases, the terminal capacitance associated with the input terminal of the cell is assigned an intermediate value between $C_{min}$ and $C_{max}$, as will be described in detail below.

The input pulse edge and output pulse edge may be respectively approximated by linear functions, as shown in FIG. 5. FIG. 5A shows a graph 40 representing a time dependent input terminal voltage UA, while FIGS. 5B-5D show graphs 45, 50 and 55 representing time dependent output terminal voltages UZ of a cell, such as inverter 6 of FIG. 1. As may be seen in FIG. 5A, the time dependent input terminal voltage UA 41 has a rising pulse edge 42 and a constant portion 43, in which the voltage has reached its steady state, typically at VDD. The rising pulse edge 42 is approximated by a linear function of time. Various quantities characterizing the input pulse edge may be defined. For example, the input slew $S_A$ is defined to be the time at which the input voltage UA increases from its low level, typically 0, to its high level, typically VDD. Further, various threshold voltages may be defined, such as the threshold voltage $U_{th}$ that is employed for defining the time delay $t_D$ between the input pulse edge and the output pulse edge, as may be seen from FIGS. 5C and 5D. Frequently, $U_{th}$ is set equal to 0.5·VDD. Additional threshold voltages may include, e.g., an upper or lower threshold voltage $U_{thu}$ and $U_{thl}$, respectively, that correspond to voltages at which the input terminal voltage UA has essentially reached the upper or lower voltage level, respectively. The characteristic time for the input terminal voltage UA to increase from $U_{th}$ to $U_{thu}$ is then given by $(U_{thu}-U_{th}) \times S_A$, where the threshold voltages $U_{th}$ and $U_{thu}$ are measured in units of VDD.

Figure 5A:
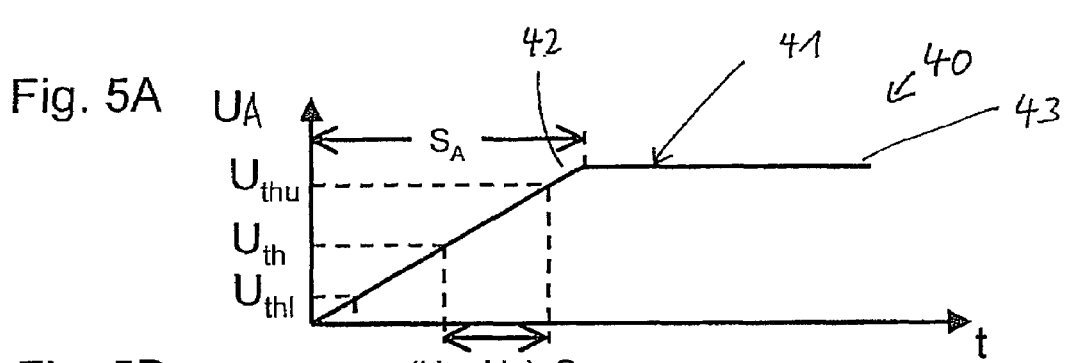
FIGS. 5A-5D are waveform diagrams illustrating the voltages at an input terminal and an output terminal, respectively, of a cell.
Figure 5B:
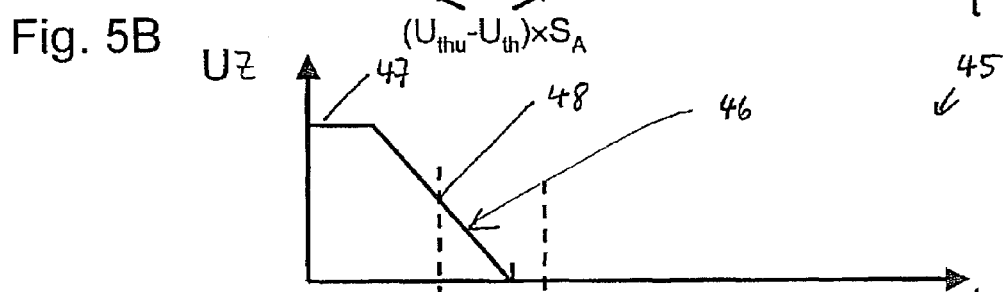
Figure 5C:
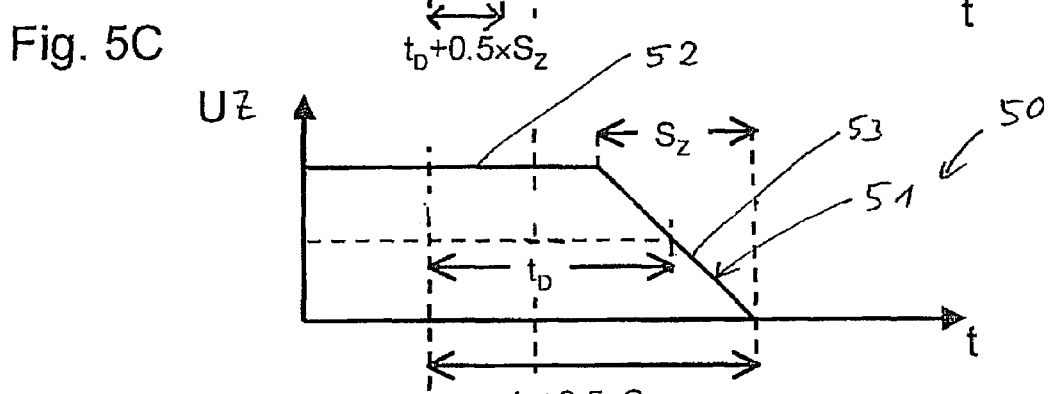
Figure 5D:
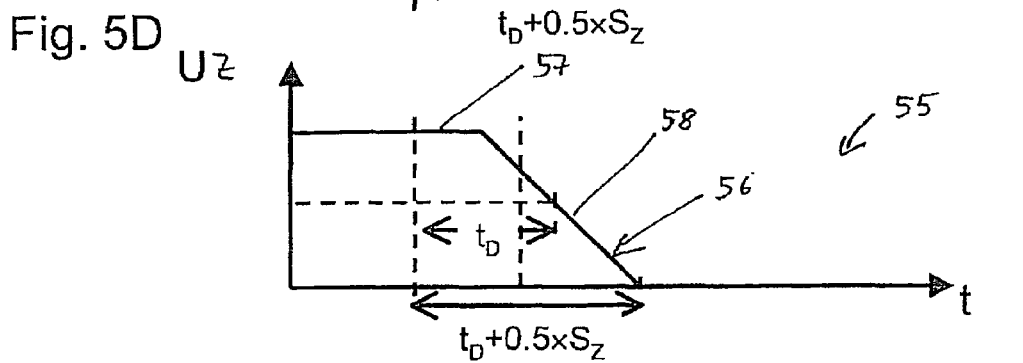

FIGS. 5B-5D show output terminal voltages UZ based on time for various values of the delay time $t_D$ between the input pulse edge and the output pulse edge. The characteristic time scale associated with the output pulse edge is defined as the output slew $S_Z$ which in the example shown corresponds to the time associated with the transition time of the output terminal from VDD to 0. As may be seen in FIGS. 5B-5D, each time dependent output voltage UZ 46, 51 and 56, respectively, comprises an approximately constant portion 47, 52, 57 and a falling edge 48, 53, 58, which latter is approximated to be linear. The time at which the output terminal voltage UZ reaches its low value, measured from the time at which the input terminal voltage reaches $U_{th}$, is given by $t_D+0.5 \times S_Z$, as may be seen in FIGS. 5B-5D. The quantity K defined as $$K=[t_d+0.5 \times S_Z-(U_{thu}-U_{th}) \times S_A]/S_Z \qquad \text{Eq. (1)}$$

provides a measure for the temporal overlap of the input pulse edge and the output pulse edge. More specifically, for K<0, the input pulse edge fully overlaps with the output pulse edge, as seen in FIG. 5B. For K>1, the input pulse edge and the output pulse edge have zero overlap, as seen in FIG. 5C. For 0<K<1, the output pulse edge partially overlaps with the input pulse edge, as seen in FIG. 5D. Based on the value of K the effective input terminal capacitance $C_A$ may therefore be assigned the following values:

$$C_A=C_{max} \text{ if } K<0, \qquad \text{Eq. (2a)}$$

$$C_A=C_{min} \text{ if } K>1, \qquad \text{Eq. (2b)}$$

$$C_A=C_{max}-K \times (C_{max}-C_{min}) \text{ if } 0 \leq K \leq 1. \qquad \text{Eq. (2c)}$$

The effective input terminal capacitance thus defined is equal to the predefined maximum capacitance $C_{max}$ for an output pulse edge that fully overlaps the input pulse edge, is equal to the minimum predefined capacitance value $C_{min}$ for an output pulse edge that has vanishing overlap with the input pulse edge, and is an interpolated value between these two values for all other cases.

It is important to note that all values entering the definition of K given in Eq. (1) above are usually readily available from the results of a timing analysis. Further, the maximum and minimum capacitance values $C_{max}$ and $C_{min}$, respectively, are usually provided in standard libraries for cells of a digital circuit. Therefore, the operation point dependent estimation value for the input terminal capacitance as defined by Eq. (2a)-Eq. (2c) above may be readily determined when a timing analysis of the digital circuit is performed, since all quantities are known.

The above explanation given with reference to FIG. 5 is only exemplary and other methods for interpolating between predefined capacitance values may be employed. For example, the input pulse edge and the output pulse edge may be approximated by functions other than the simple linear functions illustrated in FIG. 5, such as higher order polynomials or exponential functions. Further, other measures quantifying the temporal overlap of the input pulse edge and the output pulse edge may be employed instead of the relative overlap defined by the quantity K in Eq. (1).

The embodiments described with reference to FIGS. 4 and 5 above are particularly suitable for estimating a terminal capacitance of a single-stage cell, in which there may be a significant capacitive coupling between the input and output terminals.

Figure 6:
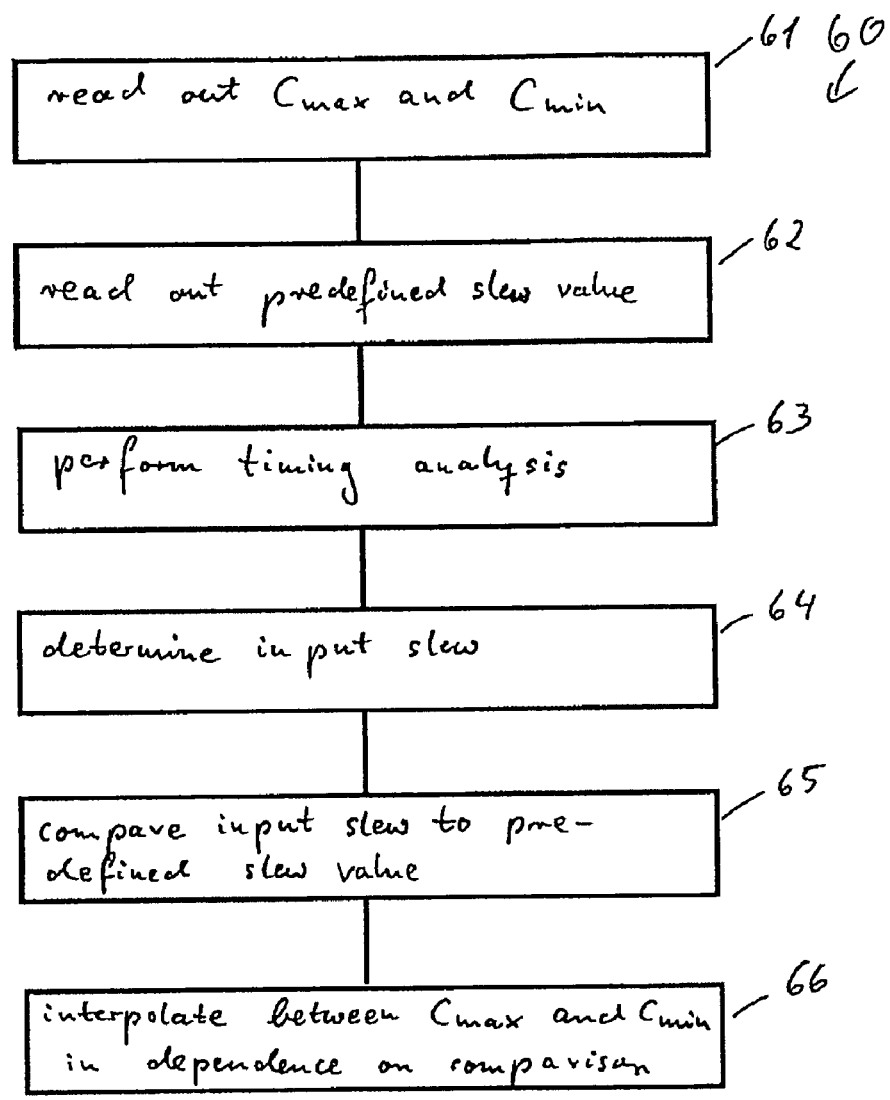
FIG. 6 is a flowchart illustrating a method for estimating a terminal capacitance.

FIG. 6 illustrates a method for estimating a terminal capacitance at a predetermined operation point, which may be useful in determining or estimating an effective terminal capacitance of a multiple-stage cell. In such multiple-stage cells, the capacitive coupling between an input terminal and an output terminal of the cell is usually weak. By contrast, there is a much stronger capacitive coupling between the input terminal and a circuit node that is hidden inside the cell and does not represent a terminal of the cell. In this case, the effective terminal capacitance of the input terminal of the cell is largely independent of the time variation of the output terminal voltage, but is rather dependent on a time variation of a voltage at the interior node of the cell that is capacitively coupled to the input terminal. The back action of the interior node onto the input terminal may be well approximated as a linear function of an input slew of the multiple-stage cell, if the input slew rate exceeds a predefined value, i.e. if the input slew $S_A$ drops below a predefined value. By contrast, if the input slew $S_A$ exceed the predefined value, the effective input terminal capacitance remains approximately constant. Therefore, to estimate the operation point dependent terminal capacitance for a multiple-stage cell, a predefined slew value $S_{A0}$ which is determined during pre-characterization of the cell is stored together with the maximum and minimum capacitance values $C_{max}$ and $C_{min}$, respectively. Equivalently, the inverse of the predefined slew value $S_{A0}$, i.e., a predefined slew rate value $1/S_{A0}$ may be stored. The predefined slew value corresponds to the input slew at which the operation point dependent input terminal capacitance becomes independent of the input slew. The predefined slew value determined by cell pre-characterization is stored together with the upper and lower bounds on the input terminal capacitance, e.g., as cell characterizing data 14 in the system of FIG. 2. It is to be understood that also a plurality of predefined slew values or a plurality of predefined slew rate values may be stored, which may represent, e.g., the input slews at which the input terminal capacitance becomes independent of the input slew for rising and falling pulse edges, respectively.

In the method 60 shown in FIG. 6, the maximum and minimum capacitance values as well as the predefined slew value just described are read out at steps 61 and 62. Subsequently, at step 63, a timing analysis is performed. The input slew $S_A$ associated with the input terminal of the multiple-stage cell is determined at step 64 and is compared to the predefined slew value $S_{A0}$ at step 65. Based on the result of the comparison, the effective terminal capacitance is determined by interpolating between the maximum and minimum capacitance values $C_{max}$ and $C_{min}$ at step 66. The effective input terminal capacitance may be obtained by the following formula:

$$C_A = C_{max} \text{ if } S_A > S_{A0} \qquad \text{Eq. (3a)}$$

$$C_A = C_{min} + (S_A - S_{Amin}) \times (C_{max} - C_{min})/(S_{A0} - S_{Amin}) \text{ if } \\ S_{Amin} \leq S_A \leq S_{A0} \qquad \text{Eq. (3b)}$$

$S_{Amin}$ represents a smallest value of input slew for which the cell behavior has been determined during cell precharacterization. This value is typically included in conventional cell libraries and is therefore readily available. Therefore, the effective terminal capacitance is set equal to the maximum capacitance value if the input slew determined or employed in the timing analysis exceeds the predefined value $S_{A0}$, and is an interpolated value between the minimum and maximum capacitance values otherwise. Equivalently, at step 62, a predefined slew rate value could be read out, and/or that at step 64 an input slew rate could be determined. Subsequently, these rates may be compared at step 65.

The above description given with reference to FIG. 6 is only exemplary, and the effective input terminal capacitance of a multiple-stage cell may also be determined in other ways employing the results, or the input parameters, of a timing analysis.

The embodiments explained with reference to FIG. 4 and with reference to FIG. 6 above may be inter-combined. More specifically, in a digital circuit that comprises both single-stage cells and multiple-stage cells, the steps of FIG. 4 may be employed to determine an estimation value for the input terminal capacitance of a single-stage cell and the steps of FIG. 6 may be employed to determine an estimation value for the input terminal capacitance of a multiple-stage cell.

Figure 7:
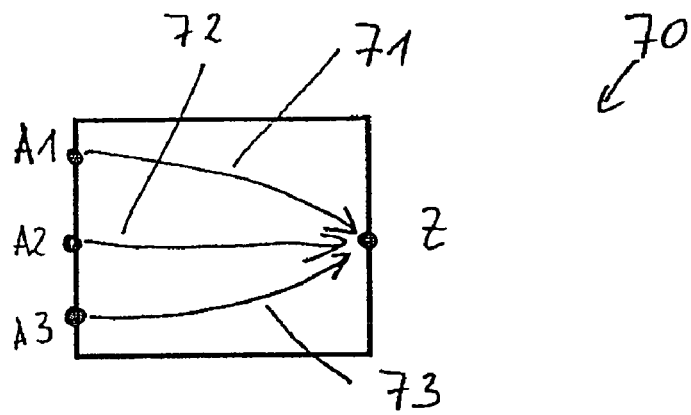
FIG. 7 is a schematic illustration of a cell having several inputs.

Still further, while the inverter 6 shown in FIG. 1 has only one input terminal and one output terminal, the various methods described above may also be readily applied to a cell of a digital circuit that has several input and/or several output terminals. Such a cell 70 is shown in FIG. 7 and comprises three input terminals A1, A2 and A3 and one output terminal Z. In a timing analysis, each of the input terminals is connected to the output terminal by a timing arc 71-73, respectively. For each of the timing arcs 71-73, the methods illustrated above may be readily employed. Therefore, the various methods and systems described herein are also applicable to cells having a plurality of input and/or output terminals.

As is evident from the above, according to various embodiments of the present invention, methods and systems are provided which allow a terminal capacitance to be estimated based on the results of, e.g., a timing analysis, of a digital circuit and on predefined capacitance values that are provided in standard cell library formats.

In tests performed using the various embodiments of the invention for determining estimation values for terminal capacitances, the thus obtained estimation values were verified to represent good estimation values for operation-point dependent terminal capacitances.

It is therefore intended that the foregoing detailed description be regarded as illustrative rather than limiting, and that it be understood that it is the following claims, including all equivalents, that are intended to define the spirit and scope of this invention.

What is claimed is:

1. A method for estimating a terminal capacitance associated with a terminal of a cell of a digital circuit, the method comprising executing instructions stored on a computer storage device that cause a processor to:
retrieve a first capacitance value associated with an upper bound on the terminal capacitance and a second capacitance value associated with a lower bound on the terminal capacitance;
perform a timing analysis of the digital circuit;
determine a temporal overlap of a pulse edge of a terminal voltage associated with the terminal and of a pulse edge of a further terminal voltage associated with a further terminal of the cell; and
determine an estimation value for the terminal capacitance based on results of the timing analysis, at least one of the first capacitance value and the second capacitance value, and the temporal overlap of the pulse edge of the terminal voltage and of the pulse edge of the further terminal voltage.

2. The method of claim 1, wherein performing the timing analysis comprises providing the terminal voltage associated with the terminal and the further terminal voltage associated with the further terminal of the cell.

3. The method of claim 1, further comprising approximating the pulse edge of the terminal voltage and the pulse edge of the further terminal voltage by a linear function.

4. The method of claim 1, further comprising determining the estimation value for the terminal capacitance by interpolating between the first capacitance value and the second capacitance value based on the temporal overlap.

5. The method of claim 1, wherein the terminal is an input terminal of the cell.

6. A method for estimating a terminal capacitance at a determined operation point, the terminal capacitance associated with an input terminal of a cell of a digital circuit, the method comprising executing instructions stored on a computer storage device that cause a processor to:
retrieve a first capacitance value associated with an upper bound on the terminal capacitance and a second capacitance value associated with a lower bound on the terminal capacitance;
determine input pulse edge characteristics associated with the input terminal in a timing analysis of the digital circuit, wherein determining the input pulse edge characteristics comprise determining an input slew;
determine output pulse edge characteristics associated with an output terminal of the cell in the timing analysis of the digital circuit; and
estimate the terminal capacitance by interpolating between the first capacitance value and the second capacitance value based on the input pulse edge characteristics and the output edge characteristics, wherein the interpolating comprises comparing the input slew with a predefined slew value.

7. The method of claim 6, further comprising executing instructions stored on the computer storage device that further cause the processor to retrieve the predefined slew value.

8. A method for characterizing a digital circuit, wherein the digital circuit includes a cell which includes a terminal, the terminal having a terminal capacitance, the method comprising executing instructions stored on a computer storage device that cause a processor to:
retrieve a first capacitance value associated with an upper bound on the terminal capacitance and a second capacitance value associated with a lower bound on the terminal capacitance;
analyze the digital circuit, wherein the terminal capacitance is approximated by one of the first capacitance value or the second capacitance value;
determine a temporal overlap of a pulse edge of a terminal voltage associated with the terminal and of a pulse edge of a further terminal voltage associated with a further terminal of the cell;
determine an estimation value for the terminal capacitance from a result of the analyzing, at least one of the first capacitance value and the second capacitance value, and the temporal overlap of the pulse edge of the terminal voltage and of the pulse edge of the further terminal voltage; and
re-analyze the digital circuit, wherein the terminal capacitance is approximated by the estimation value.

9. The method of claim 8, wherein analyzing comprises performing a timing analysis of the digital circuit.

10. The method of claim 9, wherein performing the timing analysis comprises performing a static timing analysis.

11. The method of claim 8, wherein executing instructions stored on the computer storage device further cause the processor to repeat iteratively the determining and the re-analyzing.

12. A computer program product for estimating a terminal capacitance associated with a terminal of a cell of a digital circuit, the computer program product comprising a computer storage device comprising:
computer-executable code means executable to provide a first capacitance value associated with an upper bound on the terminal capacitance and a second capacitance value associated with a lower bound on the terminal capacitance;
computer-executable code means executable to provide results of a timing analysis of the digital circuit;
computer-executable code means executable to determine a temporal overlap of a pulse edge of a terminal voltage associated with the terminal and of a pulse edge of a further terminal voltage associated with a further terminal of the cell; and
computer-executable code means executable to determine an estimation value for the terminal capacitance based on the results of the timing analysis, at least one of the first capacitance value and the second capacitance value, and the temporal overlap of the pulse edge of the terminal voltage and of the pulse edge of the further terminal voltage.

13. The computer program of claim 12, wherein the computer program product comprises an electronic design automation tool embodied in the computer storage device.

14. A computer program product for characterizing a digital circuit, wherein the digital circuit includes a cell which includes a terminal, the terminal having a terminal capacitance, the computer program product comprising a computer storage device comprising:
computer-executable code means executable to provide a first capacitance value associated with an upper bound on the terminal capacitance and a second capacitance value associated with a lower bound on the terminal capacitance;
computer-executable code means executable to analyze the digital circuit, wherein the terminal capacitance is approximated by one of the first capacitance value or the second capacitance value;
computer-executable code means executable to determine a temporal overlap of a pulse edge of a terminal voltage associated with the terminal and of a pulse edge of a further terminal voltage associated with a further terminal of the cell;

computer-executable code means executable to determine an estimation value for the terminal capacitance from a result of the analyzing, at least one of the first capacitance value and the second capacitance value, and the temporal overlap of the pulse edge of the terminal voltage and of the pulse edge of the further terminal voltage; and computer-executable code means executable to re-analyze the digital circuit, wherein the terminal capacitance is approximated by the estimation value.

15. A system for estimating a terminal capacitance associated with a terminal of a cell of a digital circuit, the system comprising:

a storage unit operable to store a first capacitance value associated with an upper bound on the terminal capacitance and a second capacitance value associated with a lower bound on the terminal capacitance;

a processor operable to execute instructions stored in the storage unit to perform a timing analysis of the digital circuit and which is coupled to the storage unit to retrieve the first capacitance value and the second capacitance value therefrom, wherein the processor is configured to determine a temporal overlap of a voltage pulse edge associated with the terminal and of a voltage pulse edge associated with another terminal of the cell, determine an estimation value for the terminal capacitance by performing an interpolation between the first terminal capacitance and the second terminal capacitance based on the temporal overlap.

16. The system of claim 15, wherein the processor is operable to execute instructions stored in the storage unit to perform a further timing analysis of the digital circuit, wherein the terminal capacitance is approximated by the estimation value.

17. The system of claim 15, wherein the storage unit further stores a predefined input slew value, and wherein the processor retrieves the input slew value from the storage unit and performs an interpolation between the first terminal capacitance and the second terminal capacitance based on the predefined input slew value to determine the estimation value.

18. A system for estimating a terminal capacitance associated with a terminal of a cell of a digital circuit, the system comprising:

storage means for storing a first capacitance value associated with an upper bound on the terminal capacitance and a second capacitance value associated with a lower bound on the terminal capacitance;

analyzing means for analyzing the digital circuit and for providing a result of the analyzing;

determining means for determining a temporal overlap of a pulse edge of a terminal voltage associated with the terminal and of a pulse edge of a further terminal voltage associated with a further terminal of the cell estimating means coupled to the storage means for retrieving the first capacitance value and the second capacitance value, coupled to the analyzing means for retrieving the result of the analyzing, and coupled to the determining means for retrieving the results of the determining, the estimating means estimating the terminal capacitance based on the result of the analyzing, at least one of the first capacitance value and the second capacitance value, and the temporal overlap.

* * * * *